United States Patent [19]

Tsay

[11] Patent Number: 5,420,820

[45] Date of Patent: May 30, 1995

[54] RAS INPUT DISABLE CIRCUIT

[75] Inventor: Ching-yuh Tsay, Richardson, Tex.

[73] Assignee: Texas Instruments Incorporated, Dallas, Tex.

[21] Appl. No.: 251,824

[22] Filed: May 31, 1994

[51] Int. Cl.6 .............................................. G11C 7/00
[52] U.S. Cl. ................................. 365/195; 365/189.07
[58] Field of Search .................... 365/195, 193, 189.07, 365/189.09, 210

[56]  References Cited

U.S. PATENT DOCUMENTS 4,918,663  4/1990  Remington et al. ........... 365/189.06

Primary Examiner—Joseph A. Popek
Assistant Examiner—A. Zarabian
Attorney, Agent, or Firm—W. Daniel Swayze, Jr.; Richard L. Donaldson

[57]  ABSTRACT

A RAS input disable circuit receives a power up detection signal and an internal reference signal to produce a RAS input disable signal to indicate memory access. The RAS input disable circuit eliminates a DC current path, established before the RAS input disable signal is produced.

10 Claims, 2 Drawing Sheets

RAS INPUT DISABLE CIRCUIT

TECHNICAL FIELD OF THE INVENTION

This present invention relates to the field of integrated circuits and more particularly directed to a RAS Input Disable Circuit for providing a RAS input disable signal.

BACKGROUND OF THE INVENTION

A RAS input disable (RID) circuit determines when the DRAM circuits are ready to accept RAS_ clock for memory access. Before these DRAM circuits can be activated by accepting the RAS_ clock signals, two voltage levels are checked. One of these levels is the internal positive supply level and the other is the internal back bias level $V_{BB}$. The RID circuit should ascertain that the internal supply is stable and determine that the $V_{BB}$ level is sufficiently low. As the portable computer becomes increasingly popular, one concern of the designers of these portable computers has been to reduce the power consumption of DRAM circuits which is a major component of power use of the portable computer. The requirement to reduce the power consumption places constraints on standby current and self-refresh current. In order to assure proper low power operation, standby current should be minimized in that all circuits should be designed so that they do not draw any DC currents. In order for the RID circuit to properly provide a RID signal, both the internal power supply level and the internal back bias level $V_{BB}$ should be at satisfactory and predetermined levels before the RID signal is to be provided. The proper internal positive supply level may be detected by the Power Up Detector (PUD) circuit which provides a PUD signal to the RID circuit. However, before the RID circuit can provide the RID signal, once the PUD signal has been received, the internal back bias level must also be established.

There are two approaches to determine if the internal back bias level is at a predetermined level. One of these approaches is a DC level detection approach and the other a transient time-based approach. The DC level detection approach ensures an internal back bias level has been established which actually depends on the level of voltage $V_{BB}$, and an example of this approach is illustrated in FIG. 1 and requires a small amount of DC current.

The inverter 102 inverts the PUD signal so that the output of the inverter 102 is high while the PUD signal is low, preventing a false RID signal from NOR gate 116. The remaining portion of the circuit detects the internal back bias level.

While voltage $V_{BB}$ is not sufficiently low for proper DRAM operations, transistor 106 is turned off, and the voltage at node 150 is raised to logically high level by P-channel transistor 104 since transistor 104 is turned on. Therefore, node 152 is initially logically low. Node 154 is set high as a result of inverter 114. Thus, after PUD is asserted high, the RID signal remains high until the voltage level at node 150 changes from high to low. Node 150 is reset to logically low when voltage $V_{BB}$ is at least one threshold voltage of an N-channel transistor, $V_{TN}$, below ground by turning transistor 106 on sufficiently enough to overdrive the effect of transistor 104. Since both transistors 106 and 104 remain on after transistor 106 has been turned on, a DC current flows from the voltage supply through transistors 104 and 106 to voltage $V_{BB}$. If this current is cut off by turning transistor 106 off then the RID signal will be set high again to inhibit further memory access. Clearly, in order to provide a stable RID signal, the transistors 104 and 106 must conduct current, resulting in power loss.

On the other hand, the transient time-based approach does not require DC current in order to provide a RID signal. However, the circuit employing the transient time-based does not measure the internal back bias level directly, but provides an approximation of the internal back bias level by a function of time. Thus, a disadvantage of the second approach is that there is no guarantee that the internal back bias level is at the proper level when the RID signal is generated.

FIG. 2 illustrates a RID circuit using this second approach. Initially, PUD is at logically low level when internal supply level is not yet established. Thus, the voltage at node 254 is charged to a high logical level by transistor 208 while transistor 206 is turned off. With node 254 being high transistor 211 is turned off, and the P-channel transistor 212 is turned on to output a high voltage at node 256. Through the inversion of transistors 216, 218 and inverter 224, a high RID is thus generated when PUD is low. As the PUD signal changes from low to high, node 254 is isolated from supply and is connected through transistor 206 to transistor 204. Since transistor 212 is also turned off, the status of node 256 is now determined solely by node 254. To change the high state at node 254, both N-channel transistors 200 and 204 must be turned on by the voltage $V_{BB}$ falling below ground such that the gate to source voltages of transistors 200 and 204 are more than the threshold voltage of the transistors 200 and 204. When this $V_{BB}$ voltage level is reached, transistors 200 and 204 are turned on to discharge node 254 to ground and consequently, node 256 goes to a logical low since transistor 212 is turned on. Thus when node 250 and node 254 go to ground, node 256 goes low indicating the disabled function is on.

Since there is no DC current path to node 254 after PUD is set high, the discharging of node 254 does not result in DC current. Hence, the detection of $V_{BB}$ is accomplished without consuming DC current.

Furthermore, since the logic state of node 254 is maintained by dynamic charge stored on capacitor 210, the exact switching point of the circuit varies as a function of the discharging current through transistors 200, 204 and 206 as well as the capacitance of capacitor 210.

SUMMARY OF THE INVENTION

The present invention provides an accurate RID signal by measuring both the internal power supply level and the true internal back bias level and eliminating the DC current while the RID signal is operative.

The present invention includes a memory device to provide a signal to indicate memory access, including, a power up detector circuit for producing a power up detection signal indicating when an internal power supply of the memory device has reached a first predetermined level, an internal reference voltage circuit to produce an internal reference signal indicating that an internal reference signal has reached a second predetermined level, and a RAS input disable circuit coupled to the power up detection circuit and coupled to the internal voltage circuit to receive the power up detection signal and to receive the internal reference signal, the RAS input disable circuit producing a RAS input disable signal based on the power up detection signal and the internal reference signal to indicate when the memory access may occur, wherein the RAS input disable circuit includes a DC current path to conduct DC current to ground while the BAS input disable signal is being produced and to eliminate the DC current path to not conduct the DC current to ground after the RAS input disable signal has been produced.

DESCRIPTION OF THE DRAWINGS

These and other features of the invention that will be apparent to those skilled in the art from the following detailed description of the invention, taken together with the accompanying drawings in which.

DETAILED DESCRIPTION OF THE INVENTION

The present invention and its advantages are understood by referring to FIGS. 1–4 of the drawings, like numerals being used for like and corresponding parts of the various drawings.

Figure 1:
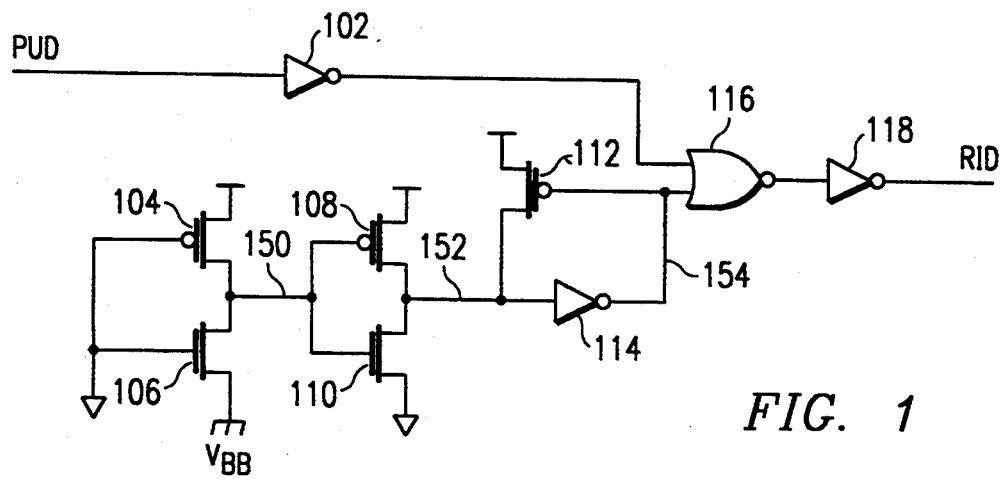
FIG. 1 is a circuit diagram of a RID circuit employing $V_{BB}$ DC level detector that consumes continuous DC current.
Figure 2:
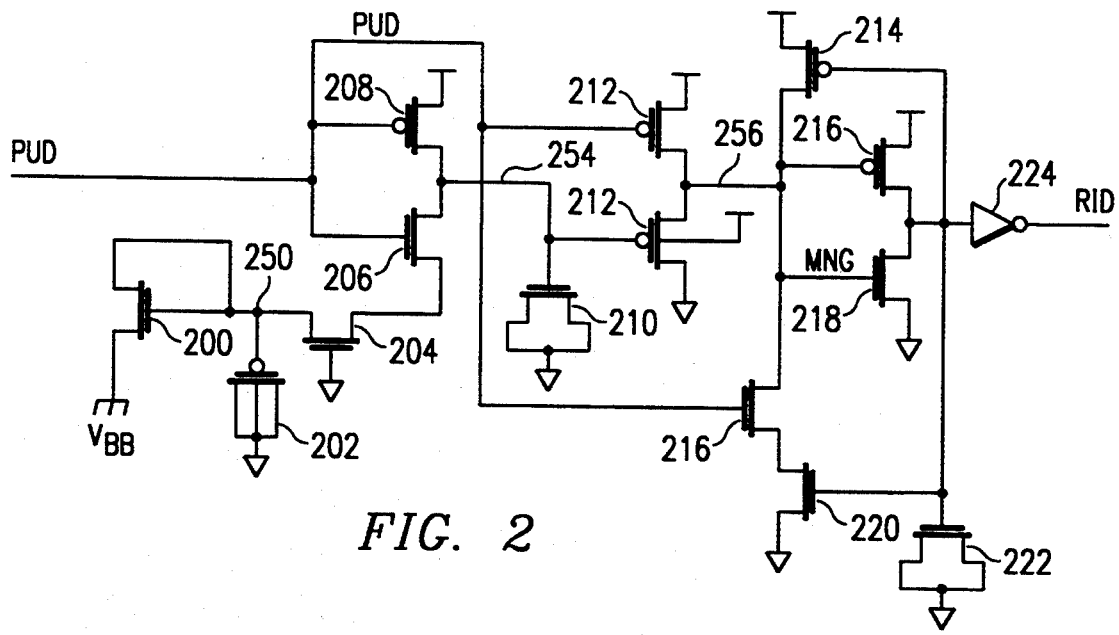
FIG. 2 is a circuit diagram of a RID circuit with internal back bias level detection through capacitor discharge (a function of time) approach.
Figure 3:
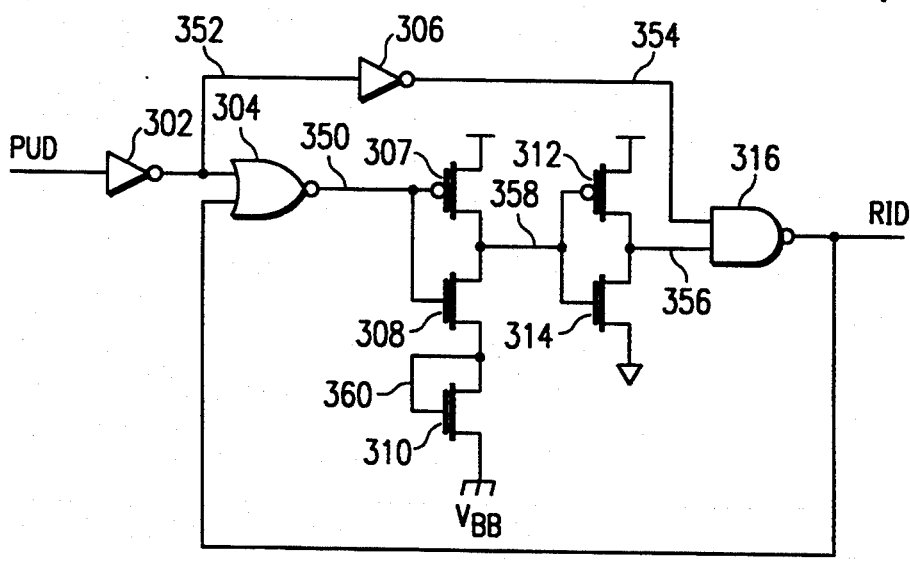
FIG. 3 is a circuit diagram to interrogate internal back bias level and internal positive power supply with no DC current.

FIG. 3 illustrates that inverter 302 inverts the voltage at the input of inverter 302 which is the PUD signal. The output of inverter 302 is connected to node 352, which is input to inverter 306 to invert the input of inverter 306. The output of inverter 306 is connected to node 354 and to NAND gate 316 to provide a logical NAND operation to produce as output the RID signal. The output of inverter 302 is additionally connected to NOR gate 304 to perform logical NOR operation. The output of NOR gate 304 is connected to the gates of both P-channel transistor 307 and N-channel transistor 308. N-channel transistor 310 is connected to the voltage $V_{BB}$ through its source, and the gate and drain of transistor 310 is connected to the source of N-channel transistor 308. The gate of transistor 308 and the gate of P-channel transistor 307 is connected to the output of NOR gate 304, thus the output of the NOR gate 304 controls the conduction of transistor 308 and 307. The drain of transistor 308 is connected to the drain of transistor 307 while the source of transistor 307 is connected to voltage $V_{DD}$. The voltage level of node 358 is dependent upon the output of NOR gate 304 and $V_{BB}$. The drains of transistors 307 and 308 are connected through node 358 to the gates of P-channel transistor 312 and N-channel transistor 314. The source of transistor 312 is connected to voltage $V_{DD}$ while the source of transistor 314 is connected to ground. The drain of transistor 312 and the drain of transistor 314 is connected through node 356 to the NAND-gate 316. In operation, initially the PUD signal, input to inverter 302, is logically low. The output of inverter 302 is logically high. Thus, the input to inverter 306 is logically high while the output of inverter 306 is logically low. Thus, the initial input to the NAND gate 316 is logically low resulting in a logically high RID signal, and the input to the NOR gate 304 is logically high. As the PUD signal goes from a logically low signal to a logically high signal, the output of inverter 302 and input to the inverter 306 is logically low. The output of inverter 306 is thus logically high. Hence, the state of RID signal now is solely dependent on that of node 356. Initially, the voltage $V_{BB}$ is at ground level, and transistor 308 is turned off while transistor 307 is turned on because of node 350 being logically low. Transistor 310 is turned off since there is no current flow through transistor 308. Thus, the voltage at node 358 is essentially $V_{DD}$ since transistor 307 is turned on. Since the voltage at the gate of transistor 314 is high, transistor 314 is turned on to provide a conduction path from the drain to the source of transistor 314. Since the drain of transistor 314 is at ground and thus node 356 is also at logically low, the output of the NAND gate 316 is high as a result of the NAND operation. Thus, as a consequence of the NOR operation of NOR gate 304, the output of NOR gate 304 is low.

As $V_{BB}$ goes below the sum of threshold voltages of N-channel transistors 310 and 308, both transistors 310 and 308 are turned on which lowers node 358 to a logical low level, as a result, transistor 314 turns off and transistor 312 turns on providing a conductive path between the source and drain of transistor 312. Thus, the voltage at node 356 raises to approximately the voltage $V_{DD}$ which is a logical high level. This logical high input to NAND gate 316 changes the output of NAND gate 316 to a logical low level. The output of NAND gate 316 is input to the NOR gate 304. Thus, since the output of the NAND gate 316 is low, the output of the NOR gate is at a high state. As the voltage at node 350 is high, transistor 307 is turned off eliminating the conduction path between the source and drain of transistor 307. Thus, with the elimination of the conduction path, there is no DC current through transistors 307, 308 and 310. Thus, the circuit of FIG. 3 determines both the internal positive supply level and determines directly the internal back bias level to provide the RID signal. Furthermore, the circuit of FIG. 3 does not draw DC current after RID signal is reset. Thus, the RID circuit of FIG. 3 saves power.

Figure 4:
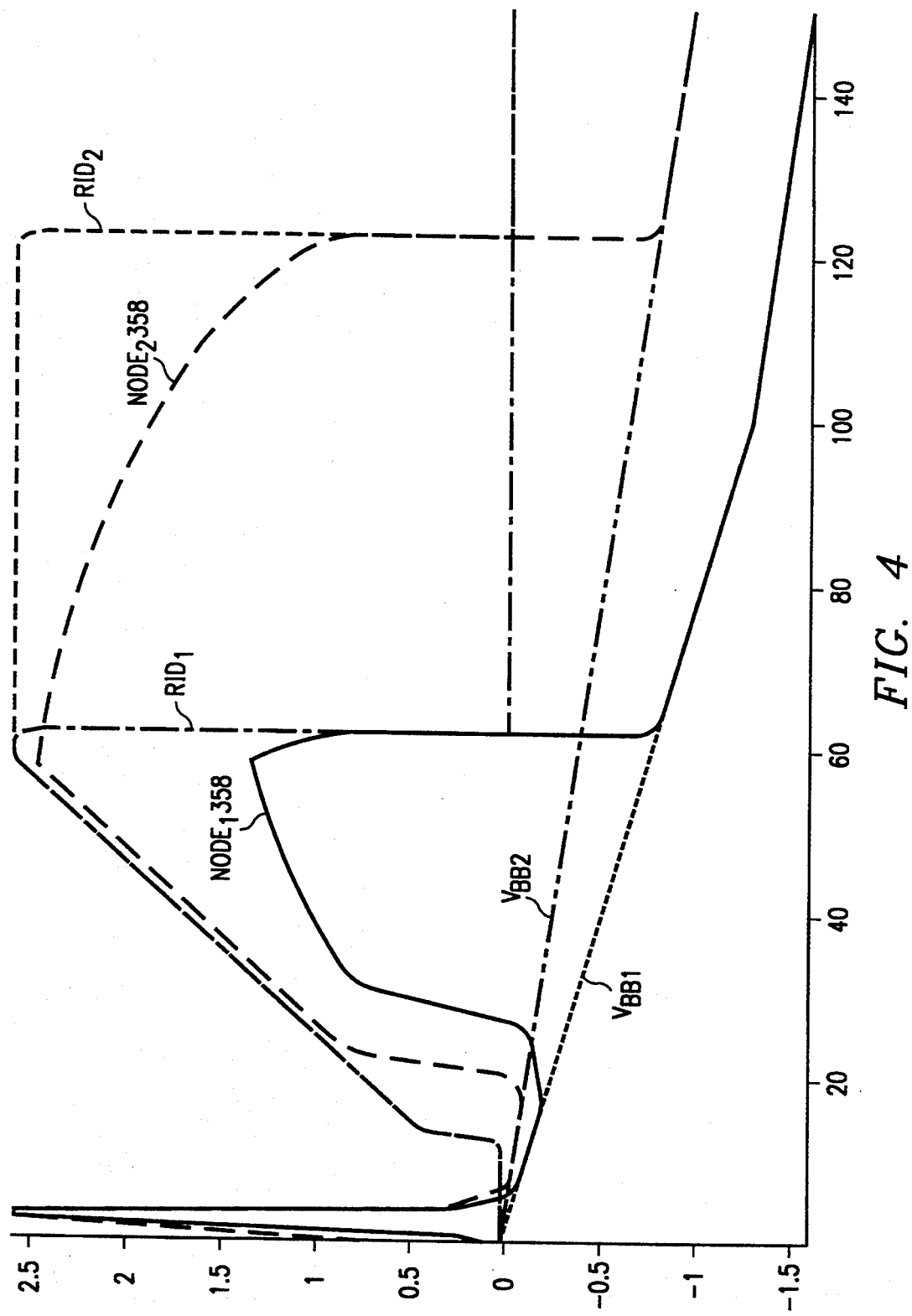
FIG. 4 illustrates the relationships of voltage and time of the RID circuit of the present invention for two $V_{BB}$ ramping rates.

FIG. 4 illustrates simulated performance of the circuits illustrated in FIG. 3 under two $V_{BB}$ ramping rates. The voltage to time relationships clearly show that the RID signals reset at the times when $V_{BB}$ reaches the same DC level, regardless of the $V_{BB}$ ramping rate, hence demonstrate that the circuit responds accurately to the DC level of $V_{BB}$.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A memory device to provide a signal to indicate memory access, comprising:
   a power up detector circuit for producing a power up detection signal indicating when an internal voltage power supply of said memory device has reached a first predetermined level;
   an internal reference voltage circuit for producing an internal reference signal and indicating that said internal reference signal has reached a second predetermined level; and a RAS input disable circuit coupled to said power up detection circuit and coupled to said internal voltage circuit to receive said power up detection signal and to receive said internal reference signal, said RAS input disable circuit producing a RAS input disable signal based on said power up detection signal and said internal reference signal to indicate when said memory access may occur;

wherein said RAS input disable circuit includes a DC current path to conduct DC current to ground while said RAS input disable signal is being produced and to eliminate said DC current path to not conduct said DC current to ground after said RAS input disable signal has been produced.

2. A memory device to produce a signal to indicate memory access as in claim 1, wherein said internal reference voltage circuit includes a circuit to indicate a DC level of said memory device.

3. A memory device to provide a signal to indicate memory access as in claim 1, wherein said RAS disable circuit includes a NAND gate circuit to provide NAND operations based on said power up detection signal and based on said internal reference signal.

4. A memory device to provide a signal to indicate memory access as in claim 1, wherein said RAS disable circuit includes a NOR gate circuit to perform NOR operation based on said internal reference signal.

5. A memory device to provide a signal to indicate memory access as in claim 1, wherein said RAS disable circuit include a NAND gate circuit to provide NAND operation based on said power up detection signal and based on said internal reference signal and a NOR gate circuit to provide NOR operation based on said internal reference signal and wherein said RAS input disable circuit further include an inverter circuit to couple said NOR gate circuit and said NAND gate circuit.

6. A RAS input disable circuit to receive a power up detection signal to indicate when an internal power supply of a memory device has reached a first predetermined level and to receive an internal reference signal to indicate when an internal back bias has reached a second predetermined level, comprising:

first circuitry to produce a RAS input disable signal based upon said power up detection signal to indicate when said internal power supply has reached said first predetermined level and based upon said internal reference signal to indicate when said internal back bias has reached said second predetermined level; and second circuitry coupled to said first circuitry to produce a direct current circuit DC current path to conduct DC current to ground before said RAS input disable signal is produced and to eliminate said DC current path to not conduct said DC current to ground after said RAS input disable signal has been produced.

7. A RAS input disable circuit to receive a power up detection signal to indicate when an internal power supply of a memory device has reached a first predetermined level and to receive an internal reference signal to indicate that an internal back bias has reached a predetermined level as in claim 6, wherein said first circuit includes a circuit to indicate a DC level of said memory device.

8. A RAS input disable circuit to receive a power up detection signal to indicate when an internal power supply of a memory device has reached a first predetermined level and to receive an internal reference signal to indicate that an internal back bias has reached a predetermined level as in claim 6, wherein said RAS input disable circuit further comprises a NAND gate circuit to provide NAND operations based on said power up detection signal and based on said internal reference signal.

9. A RAS input disable circuit to receive a power up detection signal to indicate when an internal power supply of a memory device has reached a first predetermined level and to receive an internal reference signal to indicate that an internal back bias has reached a predetermined level as in claim 6, wherein said RAS input disable circuit further comprises a NOR gate circuit to preform NOR operation based on said internal reference signal.

10. A RAS input disable circuit to receive a power up detection signal to indicate when an internal power supply of a memory device has reached a first predetermined level and to receive an internal reference signal to indicate that an internal back bias has reached a predetermined level as in claim 6, wherein said RAS input disable circuit further comprises a NAND gate circuit to provide NAND operations based on said power up detection signal and based on said internal reference signal and a NOR gate circuit to provide NOR operations based on said internal reference signal and wherein said RAS input disable circuit further comprises an inverter circuit to couple said NOR gate circuit and said NAND gate circuit.

* * * * *